(12) United States Patent
Hu et al.

(10) Patent No.: US 9,613,894 B2
(45) Date of Patent: Apr. 4, 2017

(54) ELECTRONIC PACKAGE

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/990,887

(22) Filed: Jan. 8, 2016

(65) Prior Publication Data
US 2016/0211204 A1 Jul. 21, 2016

(30) Foreign Application Priority Data
Jan. 16, 2015 (CN) .......................... 2015 1 0022799

(51) Int. Cl.
H01L 23/48 (2006.01)
H01L 23/498 (2006.01)
H01L 23/13 (2006.01)

(52) U.S. Cl.
CPC ........ *H01L 23/49822* (2013.01); *H01L 23/13* (2013.01); *H01L 23/49827* (2013.01); *H01L 23/49861* (2013.01); *H01L 23/49816* (2013.01); *H01L 2224/13* (2013.01); *H01L 2224/16* (2013.01); *H01L 2224/18* (2013.01); *H01L 2224/48091* (2013.01); *H01L 2224/73265* (2013.01); *H01L 2924/0002* (2013.01); *H01L 2924/15311* (2013.01); *H01L 2924/181* (2013.01)

(58) Field of Classification Search
CPC ......... H01L 23/49575; H01L 23/49816; H01L 23/49541; H01L 23/4952
See application file for complete search history.

(56) References Cited

U.S. PATENT DOCUMENTS 9,331,006 B2 * 5/2016 Nakao ............... H01L 23/49579

* cited by examiner

*Primary Examiner* — Roy Potter
*Assistant Examiner* — Paul Patton
(74) *Attorney, Agent, or Firm* — Amin, Turocy & Watson LLP

(57) ABSTRACT

An electronic package is provided. The electronic package includes an insulator having a recessed portion formed therein; an electronic element embedded in the recessed portion and having a sensing region exposed from the insulator; and a conductive structure disposed on the insulator and electrically connected with the electronic element. The overall thickness of the electronic package is reduced by embedding the electronic element which is embedded in the recessed portion.

16 Claims, 9 Drawing Sheets

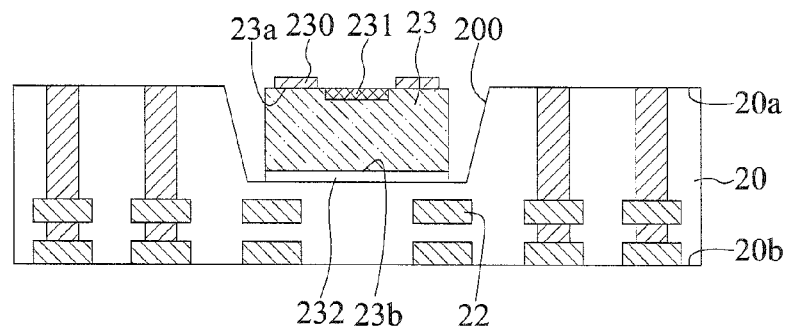
FIG.2B
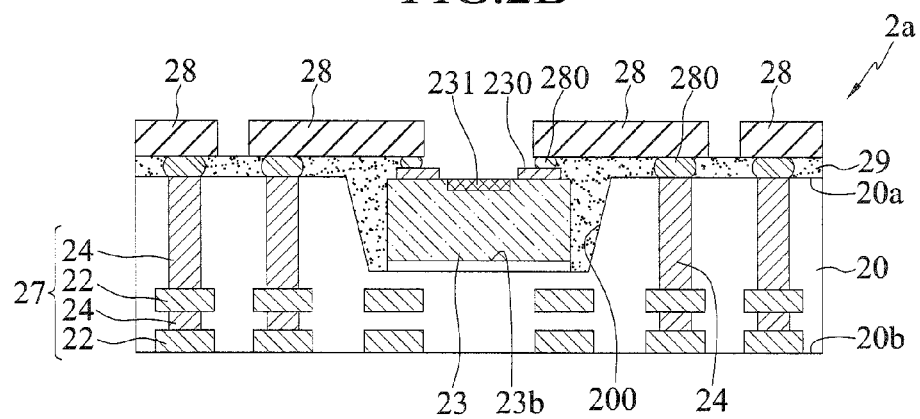
FIG.2C
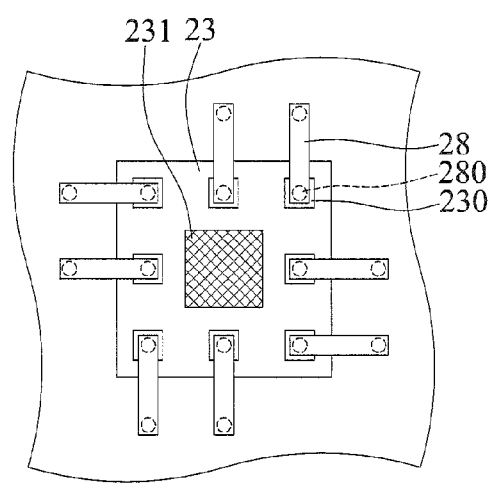
FIG.2C'
FIG.2C"

ELECTRONIC PACKAGE

BACKGROUND

1. Technical Field

The present disclosure relates to an electronic package, and, more particularly, to a thinned electronic package.

2. Description of Related Art

As the electronic industry is rapidly advancing, electronic products are required to have multi-functionality and high performance. Accordingly, a variety of packaging forms are developed in the market by the semiconductor packaging techniques.

The electronic elements for use in a sensing element or a camera lens adopt a wire bonding package form or a chip on board (COB) form.

As shown in FIG. 1A, a conventional wire bonding package 1 includes a substrate 10, an electronic component 13, and an encapsulant 18.

The substrate 10 has a first wiring layer 11 and a second wiring layer 12 respectively disposed on the top and bottom side thereof, respectively. The first wiring layer 11 and the second wiring layer 12 are electrically connected with each other via a conductor 14, such as a via and blind hole, formed therebetween. a first insulating protective layer 16 and a second insulating protective layer 17 are respectively formed on the top and bottom sides, and portions of the first and the second wiring layers 11, 12 are respectively exposed from the first and second insulating protective layers 16, 17. A plurality of conductive elements 15 are formed on the second wiring layer 12.

The electronic component 13 is a sensing element formed on the top side of the substrate 10, and electrically connected with the first wiring layer 11 via a plurality of gold wires 130. The electronic component 13 has a sensing region 131 on the top surface thereof for fingerprint identification.

The encapsulant 18 is formed on the top surface of the substrate 10 for encapsulating the electronic component 13 and the gold wires 130.

In a conventional wire bonding package 1, the thickness d (for effective detection) of the encapsulant 18 covering the sensing region 131 must be extremely thin (otherwise unable to detect). Therefore, extremely high precision is required.

However, the gold wires 130 each has a stretched arc, such that during a molding process, the encapsulant 18 has a sufficient thickness to evenly cover the electronic component 13, making thinning of the encapsulant 18 difficult. Thus, it is difficult to meet the thinning requirement of the wire bonding package 1.

FIG. 1B is a cross-sectional schematic view showing a conventional COB type package 1'. As shown in FIG. 1B, the COB type package 1' includes a substrate 10', an IC electronic component 13 of a camera lens, a transparent element 19 and an encapsulant 18. The structure of the substrate 10' is illustrated in FIG. 1A.

The electronic component 13 is formed on the top side of the substrate 10', and electrically connected to the substrate 10' via the plurality of gold wires 130. The electronic component 13 has the sensing region 131 on the top surface thereof for the light sensing purpose.

The transparent element 19 is formed on the top surface of the electronic component 13 via a plurality of supporting element 190, and covers the sensing region 131.

The encapsulant 18 is made of a non-transparent material, and is formed on the top side of the substrate 10 for encapsulating the transparent element 19, the electronic component 13, and the gold wires 130. The top surface of the transparent element 19 is exposed from the encapsulant 18.

In the conventional COB type package 1', the camera lens needs to be thinned. However, the electronic component 13 needs to be adhered on the substrate 10', and the transparent element 19 needs to be disposed on the electronic component 13 via a supporting element 190. As such, it is difficult to make the COB type package 1' thinner.

In light of the foregoing drawbacks, through silicon vias (TSV) applied in semiconductors are employed in packaging. As shown in FIG. 1C, a conventional photo sensing package 1" includes a silicon substrate 10" and a transparent element 19'.

The silicon substrate 10" has the first wiring layer 11 and the second wiring layer 12 formed on the top and bottom sides thereof, respectively, The first wiring layer 11 and the second wiring layer 12 are electrically connected with each other by a through silicon via 100 formed therebetween. The sensing region 131 is formed on the top side of the silicon substrate 10" and an insulating protective layer 17' is formed on the bottom side of the silicon substrate 10". A portion of the second wiring layer 12 is exposed from the insulating protective layer 17'. In addition, the plurality of conductive elements 15 are formed on the exposed surface of the second wiring layer 12.

The transparent element 19' is formed on the top side of the silicon substrate 10" via an adhesive layer 190' for covering the sensing region 131.

However, in the conventional photo sensing package 1", the fabrication of the through silicon vias 100 involves a high cost and integration and technical difficulties, especially the fabrication of an electronic component used in a sensor or a camera lens involves a particularly high cost.

Thus, there is a currently urgent need in the art for solving the problems of the prior art.

SUMMARY

In view of the foregoing drawbacks, the present disclosure provides an electronic package, including: an insulator having a first surface having at least one recessed portion and a second surface opposing the first surface; an electronic component disposed in the recessed portion, and having at least one sensing region exposed from the first surface of the insulator; and a conductive structure disposed on the first surface of the insulator, and electrically connected with the electronic component, without covering the sensing region.

The present disclosure further provides an electronic package, including: an insulator having a first surface with at least one recessed portion and a second surface opposing the first surface; an electronic component disposed in the recessed portion, and having at least one sensing region exposed from the first surface of the insulator; a conductive structure disposed on the first surface of the insulator, and electrically connected with the electronic component, without covering the sensing region; and a covering layer covering the sensing region.

In one embodiment of the aforesaid electronic packages, the insulator has a wiring structure coupling with the first surface and electrically connected with a wiring structure of the conductive structure. For example, the wiring structure may or may not contact the electronic component.

In one embodiment of the aforesaid electronic packages, the recessed portion has a bottom surface made of a metal material for coupling with the electronic component.

In one embodiment of the aforesaid electronic packages, the first surface of the insulator has thereon a wiring layer electrically connected with the conductive structure.

In one embodiment of the aforesaid electronic packages, the conductive structure is electrically connected with the electronic component via a plurality of conductive bumps.

In one embodiment of the aforesaid electronic packages, the conductive structure is disposed on the first surface of the insulator via a bonding material, and the bonding material may or may not cover the sensing region.

In one embodiment of the aforesaid electronic packages, a bonding material is further formed in the recessed portion to securely position the electronic component therein.

In one embodiment of the aforesaid electronic packages, the conductive structure is a lead frame, or the conductive structure includes a lead frame having a plurality of openings and a plurality of conductive bumps disposed in the openings.

In one embodiment of the aforesaid electronic packages, insulating protective layers are further formed on the first surface of the insulator.

In one embodiment of the aforesaid electronic packages, a plurality of conductive elements are further formed on the second surface of the insulator.

In one embodiment of the aforesaid electronic packages, at least one electronic component is further disposed in the insulator. For example, the electronic component can be an active component, a passive component or a combination thereof.

In one embodiment of the aforesaid electronic packages, a transparent element is further formed to cover the sensing region.

In one embodiment of the aforesaid electronic packages, a plurality of conductive pillars are embedded in the insulating layer, and electrically connected with the conductive structure.

In summary, the electronic package according to the present disclosure has electronic components embedded in the recessed portion to reduce the thickness of the package.

BRIEF DESCRIPTION OF THE DRAWINGS

FIGS. 2A-2D are cross-sectional schematic views showing a method of fabricating an electronic package according to a first embodiment of the present disclosure, wherein FIG. 2A' is another aspect of FIG. 2A; FIG. 2C' is a partial top view of FIG. 2C; and FIG. 2C" is a bottom view of the conductive structure of FIG. 2C;

FIGS. 2A-1 to 2A-4 are other variations of FIG. 2A;

FIGS. 2D-1 to 2D-3 are other variations of FIG. 2D;

FIGS. 4 and 4' are cross-sectional schematic views showing an electronic package according to a third embodiment of the present disclosure.

DETAILED DESCRIPTION OF THE PREFERRED EMBODIMENTS

The present disclosure is described in the following with specific embodiments, so that one skilled in the pertinent art can easily understand other advantages and effects of the present disclosure from the disclosure of the present specification.

It should be noted that the structures, proportions, sizes, etc. illustrated in the figures appended to the present specification are all merely used for coping with the content of disclosure of the present specification, so as to enhance the understanding and perusal of one skilled in the art. They are not used to limit the implemental limitations of the present disclosure, such that they lack substantial technical meanings. Without affecting the effect brought about and the goals to be achieved by the present disclosure, any modification of a structure, alteration of a proportion or adjustment of a size should still fall within the scope of the technical content disclosed in the present disclosure. At the same time, terms, such as "above," "below," "top," "first," "second," "one," etc. used in the present specification, are merely for the clarity of the descriptions, rather than limit the implemental scope of the present disclosure. Without substantially altering the technical content, an alteration or adjustment of relative positioning can also be regarded as an implemental scope of the present disclosure.

FIGS. 2A to 2D are cross-sectional schematic views showing a method of fabricating an electronic package according to a first embodiment of the present disclosure. The electronic packages 2a to 2e in the embodiment of the present disclosure is used in fingerprint identification.

Figure 1A:
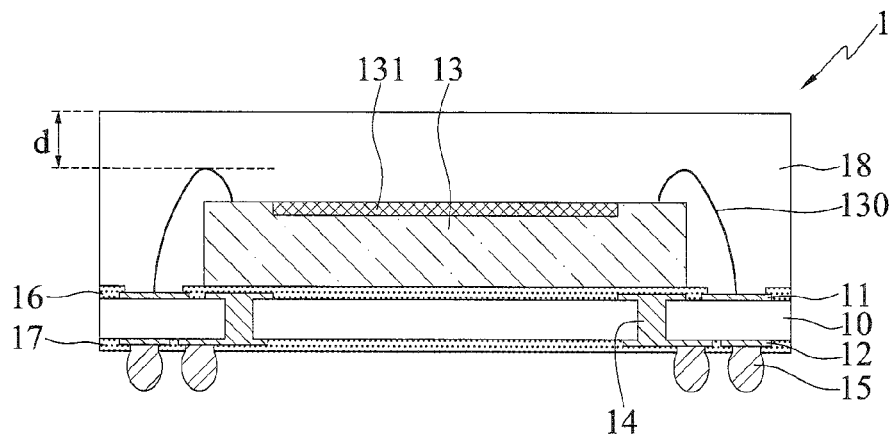
FIG. 1A is a cross-sectional schematic view of a conventional wire bonding package.
Figure 1B:
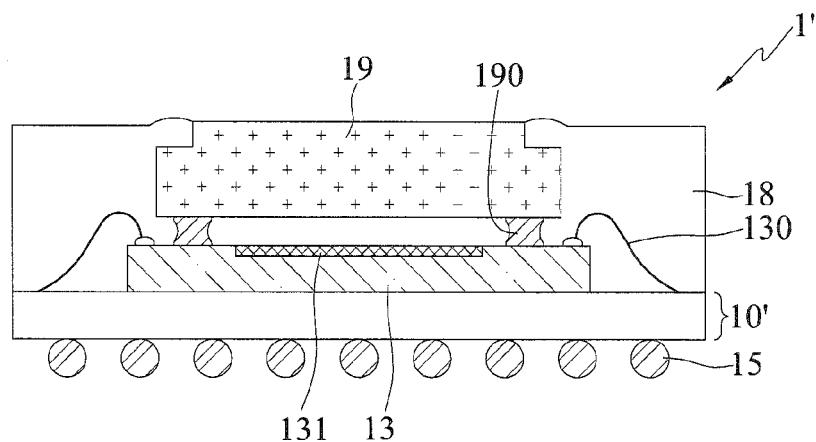
FIG. 1B is a cross-sectional schematic view of a conventional COB type package.
Figure 1C:
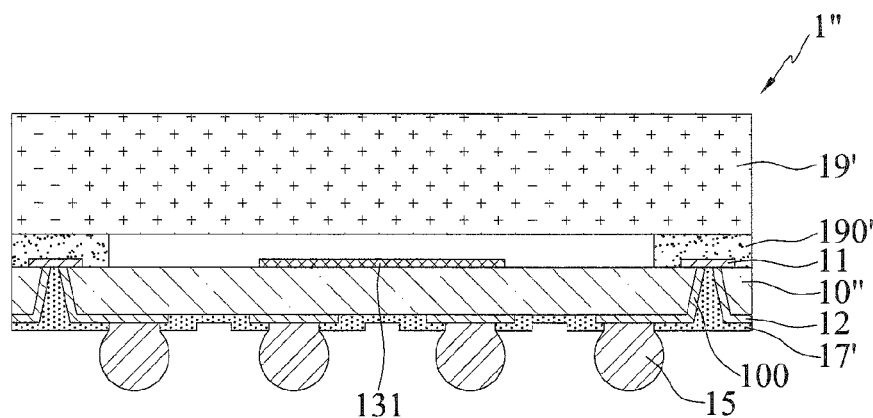
FIG. 1C is a cross-sectional schematic view of a conventional photo sensing package.
Figure 2A:
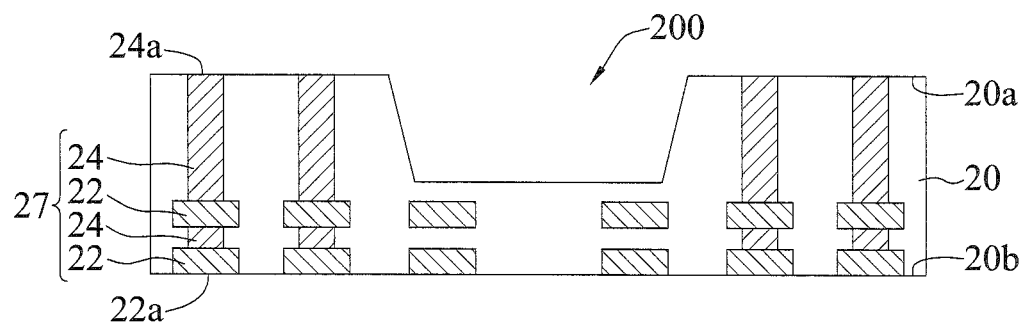
Figure 2A:
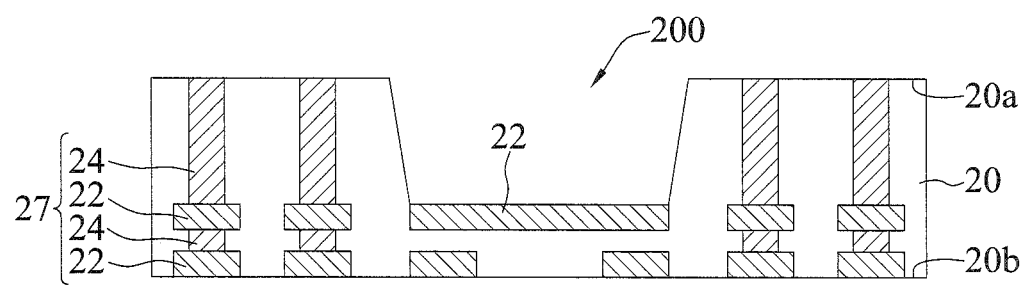

As shown in FIG. 2A, an insulator 20 is formed. The insulator 20 has a first surface 20a having a recessed portion 200 thereon and a second surface 20b opposing the first surface 20a.

In an embodiment, the insulator 20 is a molding compound, a dielectric material, or an organic resin (such as epoxy resin, polyimide (PI), and other photosensitive or non-photosensitive materials).

Further, the insulator 20 has a wiring structure 27 therein, and the wiring structure 27 connects the first surface 20a with the second surface 20b. More specifically, the wiring structure includes a plurality of first wiring layers 22 and a plurality of conductive pillars 24. The conductive pillars 24 are formed to interconnect the first wiring layers 22 and are coupled to the first surface 20a, such that terminal surfaces 24a of the conductive pillars 24 function as electrical contact pads. The first wiring layers 22 are coupled to the second surface 20b, allowing the exposed surface 22a of the first wiring layers 22 to function as electrical contact pads. For instance, electroplating, depositing or etching in a patterning process is employed, to form the first wiring layers 22 (such as a copper materials) and conductive pillars 24 (such as copper pillars). The exposed surfaces 22a of the first wiring layers 22 can be flush with, or slightly higher or lower than the second surface 20b of the first insulator 20, and the terminal surfaces 24a of conductive pillars 24 are flush with, or slightly higher or lower than the first surface 20a.

Further, as shown in FIG. 2A', the first wiring layers 22 can be exposed from the bottom surface of the recessed portion 200, such that the bottom surface of the recessed portion 200 is made of a metal material.

Figures 1, 2A:
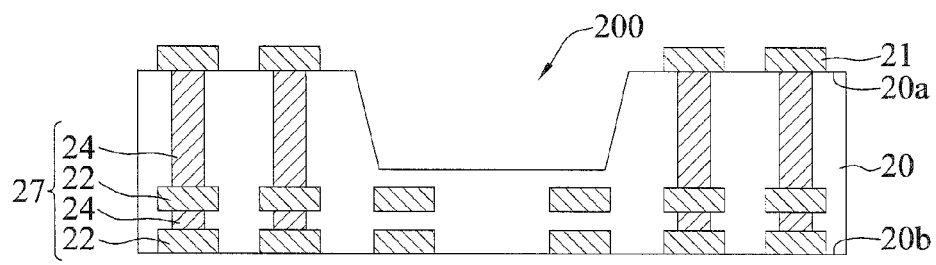
Figures 2, 2A:
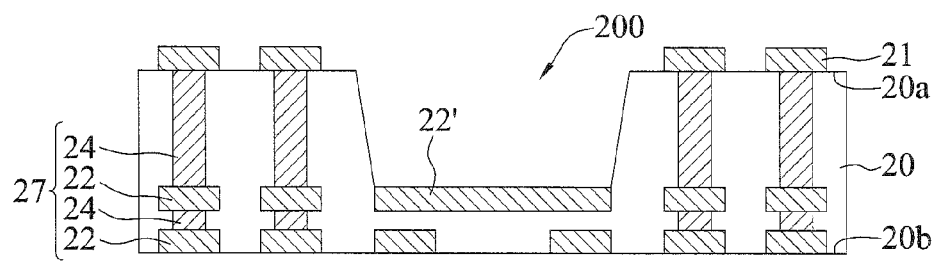

In addition, as shown in FIGS. 2A-1 and 2A-2, which are variations corresponding to FIGS. 2A and 2A', the insulator 20 has second wiring layers 21 on the first surface 20a thereof, and the second wiring layers 21 are electrically connected with the conductive pillars 24 of the wiring structure 27. For instance, electroplating, depositing or etching in a patterning process is employed, to form the second wiring layers 21 (such as a copper material) with a plurality of electrical contact pads (not shown).

Figures 2, 2A, 3:
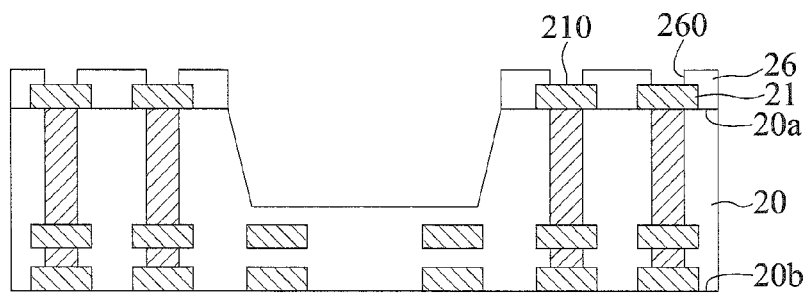

Alternatively, as shown in FIG. 2A-3, which corresponds to FIG. 2A-1, insulating protective layers 26 (such as dielectric materials) are formed on the first surface 20a of the insulator 20 and the second wiring layers 21. The insulating protective layers 26 expose portions of the second wiring layers 21 (that is, a plurality of electrical contact pads 210). For example, the insulating protective layer 26 each has a plurality of openings 260, allowing the electrical contact pads 210 each to be exposed from each of the openings 260.

Alternatively, as shown in FIG. 2A-4, which corresponds to FIG. 2A-2, insulating protective layers 26' (such as dielectric layers or solder mask layers) are formed on the first surface 20a of the insulator 20 and the second wiring layers 21, allowing the insulating protective layers 26' to expose the top surfaces of the second wiring layers 21.

As shown in FIG. 2B, an electronic component 23 is disposed in the recessed portion 200. More specifically, the electronic component 23 is a sensing element (such as a semiconductor chip), which has an active surface 23a and a non-active surface 23b opposing the active surface 23a. The active surface 23a has a sensing region 23 lfor light sensing or fingerprint identification and a plurality of electrode pads 230, such that the sensing region 231 and the electrode pads 230 are exposed from the first surface 20a of the insulator 20.

In an embodiment, the electronic component 23 is adhered on the bottom surface of the recessed portion 200 via an adhesive layer 232 formed on the active surface 23b.

Further, the first wiring layers 22 do not contact the non-active surface 23b of the electronic component 23, and the insulator 20 is formed between the first wiring layers 22 and the non-active surface 23b of the electronic component 23.

As shown in FIG. 2C, a plurality of conductive structure 28 are disposed on the first surface 20a of the insulator 20, and electrically connected with the electronic component 23 and the wiring structure 27, without covering the sensing region 231.

In an embodiment, as shown in FIGS. 2C' and 2C", the conductive structure 28 is a lead frame. A plurality of conductive bumps 280 (such as those made of solder materials or metal adhesives) are in contact with the electrode pads 230 and conductive pillars 24, for electrically connecting with the electronic component 23 and the wiring structure 27. However, the conductive structure 28 is not electrically connected with the non-active surface 23b of the electronic component 23.

Further, the conductive structure 28 is formed on the first surface 20a of the insulator 20 by a bonding material 29, wherein the bonding material 29 is an insulating resin material, and is further formed in the recessed portion 200 for holding the electronic component 23 in place. More specifically, the bonding material 29 covers a partial region of the active surface 23a of the electronic component 23, but the bonding material 29 does not cover the sensing region 231.

In addition, following the procedures described in 2A-1 to 2A-4, the conductor bumps 280 of the conductive structure 28 are in contact with the electrical contact pads 210 of the second wiring layers 21, for electrically connecting with the wiring structure 27.

Figures 2, 2A, 3, 4:
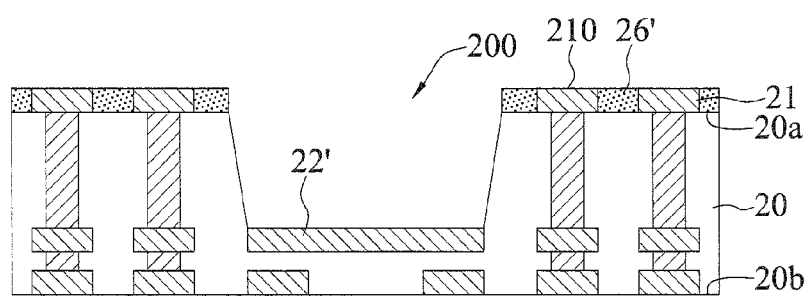
Figure 2D:
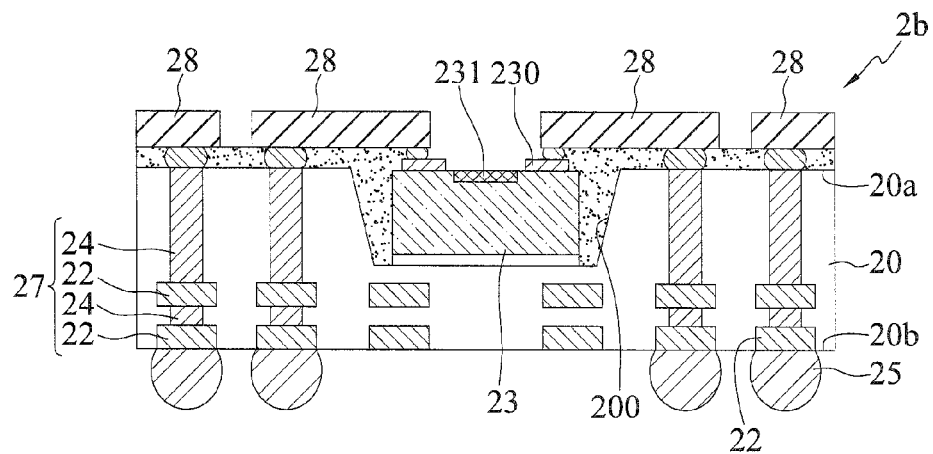
Figures 1, 2D:
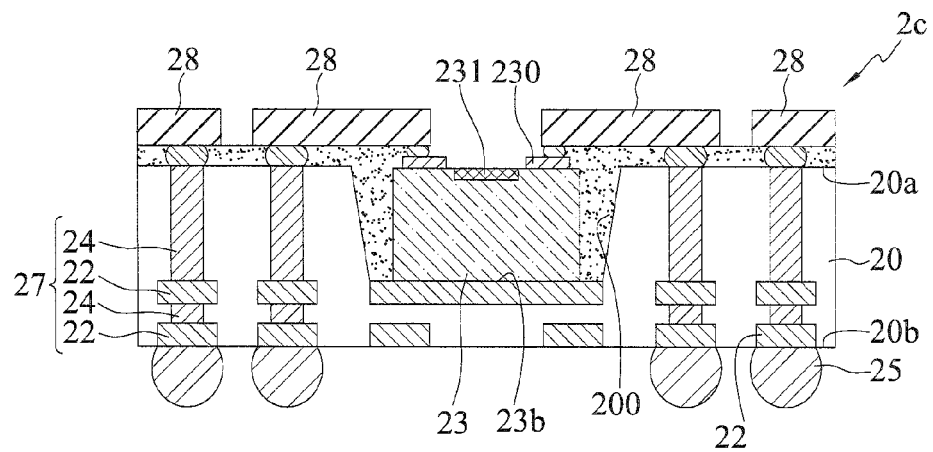
Figures 2, 2D:
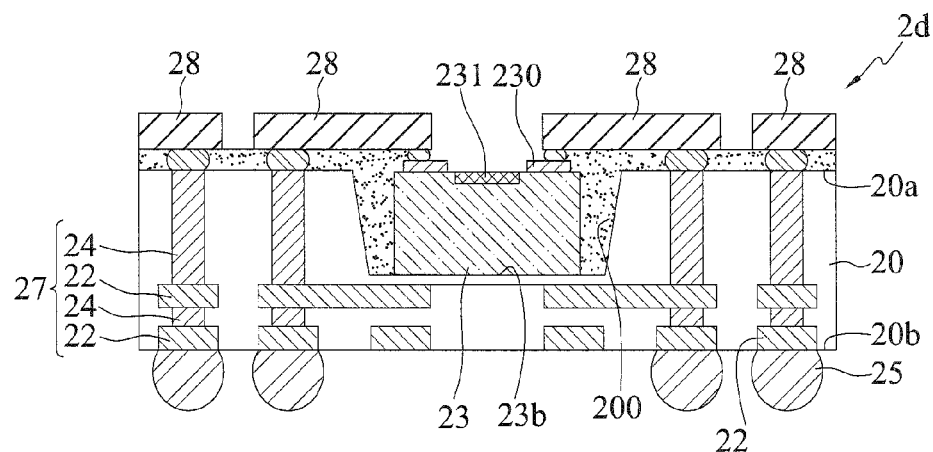
Figures 2, 2D, 3:
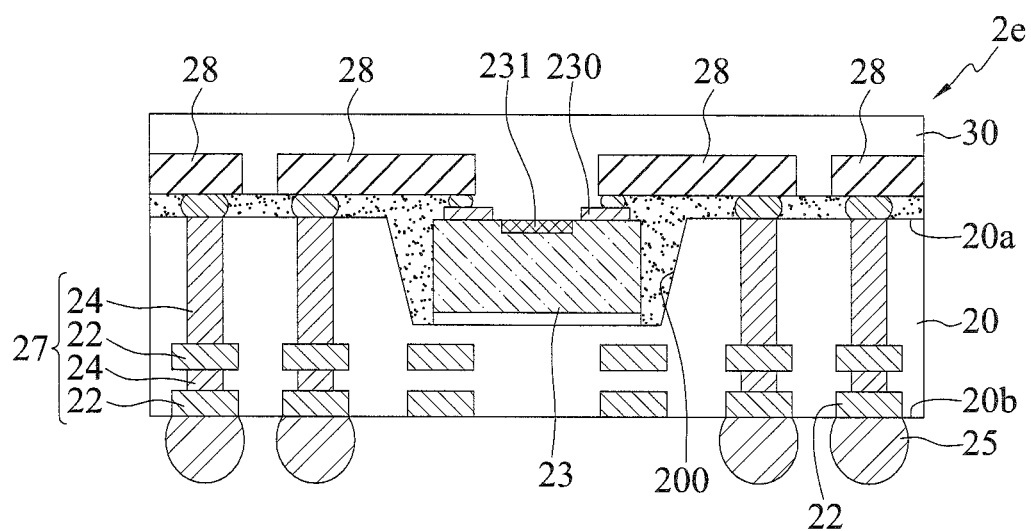

As shown in FIG. 2D, a plurality of conductive elements 25 (such as solder balls) are formed on the second surface 20b of the insulator 20, to form a ball grid array package (BGA).

In an embodiment, the conductive elements 25 may be in various forms, such as solder balls, solder bumps, copper bumps, but are not limited thereto. The conductive elements 25 are formed on the first wiring layers 22 for electrically connecting with the wiring structure 27, allowing the electronic package 2a to 2e to be mounted on an electronic device (such as a printed circuit board) via the conductive elements 25.

Further, following the procedure described in FIG. 2A', as shown in FIG. 2D-1, the first wiring layer 22 is made in contact with (or bonded to via an adhesive layer) the non-active surface 23b of the electronic component 23, such that heat can be dissipated from the electronic component 23. Alternatively, as shown in FIG. 2D-2, the conductive pathway formed by the conductive structures 28, the conductive pillars 24, and the first wiring layers 22 extends to the bottom of the non-active surface 23b of the electronic component 23.

Further, as shown in FIG. 2D-3, a covering layer 30 (such as an insulating layer 30) is formed on the conductive structure 28, for covering the sensing region 231.

In addition, following the procedures described in FIGS. 2A-3 and 2A-4, the insulating protective layers 26, 26' do not cover the sensing region 231.

In another embodiment, as shown in FIG. 2C, the electronic package 2a may be incorporated in a land grid array (LGA), or directly mounting the electrical contact pads of the first wiring layers 22 on an electronic device (such as a printed circuit board), without the need of forming the conductive elements 25.

In the electronic packages 2a to 2e of the present disclosure, because the electronic component 23 is disposed in the recessed portion 200 of the insulator 20, the overall thickness of each of the packages is desirably reduced.

Further, since the conductive structure 28 is a flat lead frame, no arc is generated. This enables the packages to be further reduced in thickness.

Figure 3A:
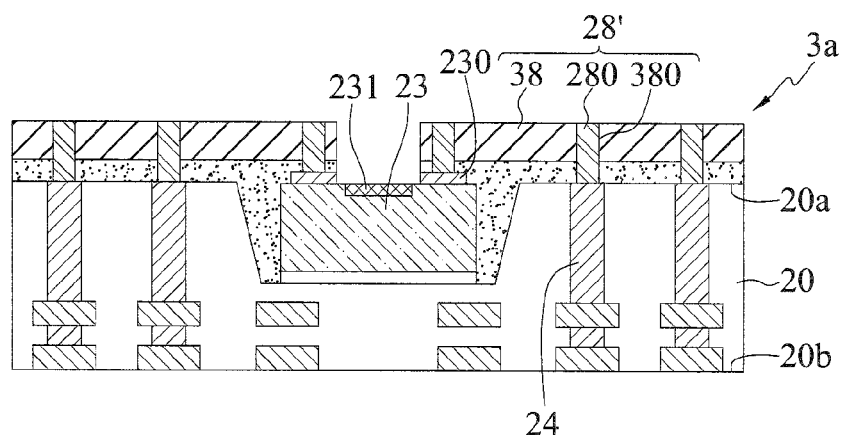
FIGS. 3A and 3B are cross-sectional schematic views showing an electronic package according to a second embodiment of the present disclosure, wherein FIG. 3A' is a bottom view of the conductive structure of FIG. 3A.
Figure 3A:
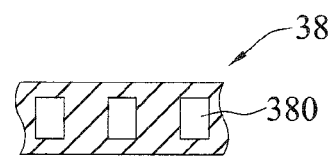
Figure 3B:
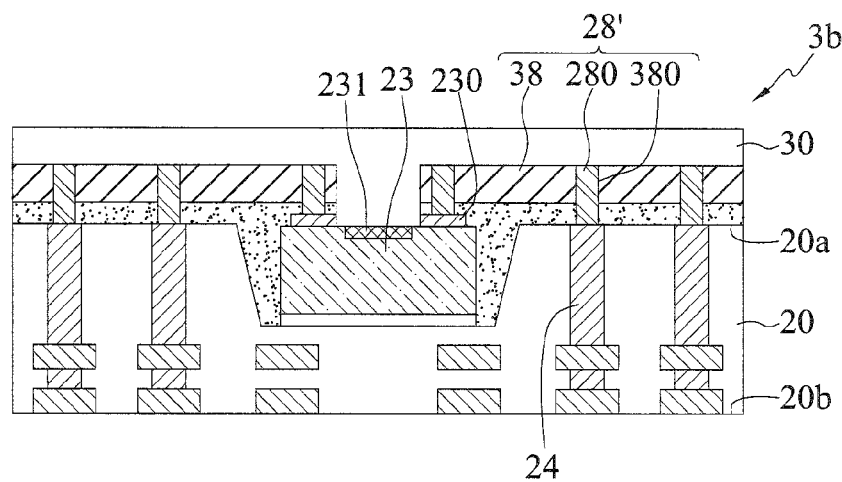
Figure 4:
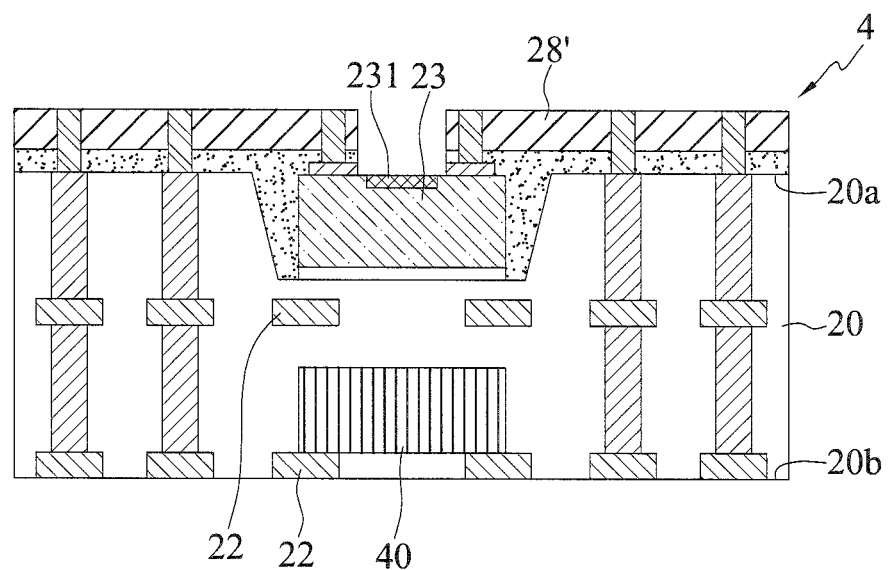
Figure 4:
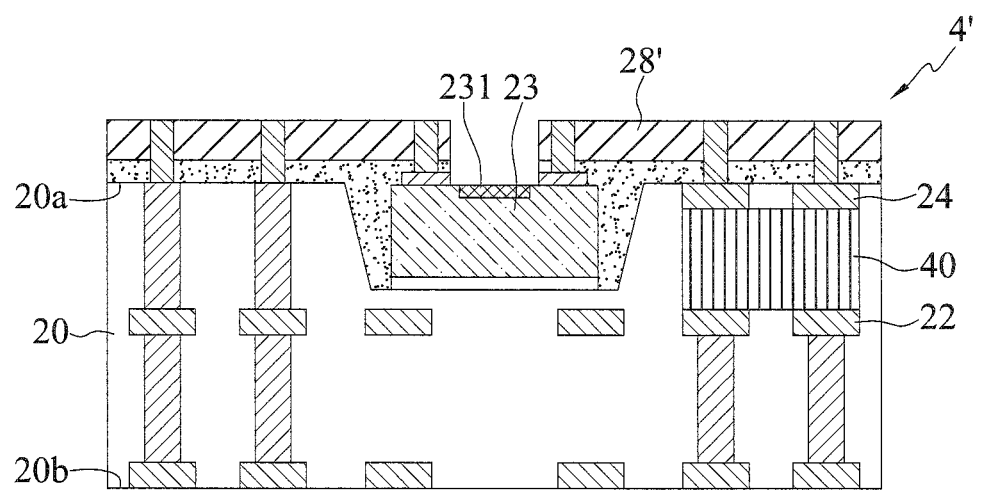

FIGS. 3A and 3B are cross-sectional schematic views showing electronic packages 3a, 3b according to a second embodiment of the present disclosure. The difference between the first and second embodiments is in the design of the conductive structure 28', and the rest of the structures are substantially similar. Therefore, the identical parts will not be described hereinafter for brevity.

As shown in FIGS. 3A and 3A', the conductive structure 28' includes a lead frame 38 having a plurality of openings 380 and a plurality of conductive bumps 280, and the conductive bumps 280 are disposed in the openings 380 for electrically connecting with the electrode pads 230 and conductive pillars 24.

During the fabrication, the lead frame 38 is firstly disposed on the first surface 20a of the insulator 20, with the openings 380 formed at positions corresponding to the positions of the electrode pads 230 and the conductive pillars 24 (or the electrical contact pads 210), followed by forming a conductive material (such as a solder material or a metal adhesive) in the openings 380 to serve as the conductive bumps 280.

Further, as shown in FIG. 3B, a transparent insulating covering layer 30 may be formed on the conductive structure 28', to cover the sensing region 231.

FIGS. 4 and 4' are cross-sectional schematic views showing an electronic package according to a third embodiment of the present disclosure. This embodiment differs from the second embodiment in the addition of a passive component 40, and the rest of the structures are substantially similar. Therefore, the identical parts will not be described hereinafter for brevity.

FIGS. 4 and 4' show examples of another electronic component 40 disposed in the insulator 20.

In this embodiment, the electronic component 40 is an active component, a passive component or a combination thereof. The active component may be, for example, a semiconductor chip. The passive component, may be, for example, a resistor, a capacitor or an inductor. The electronic component 40 is a passive component herein.

Further, as shown in FIG. 4, the electronic component 40 may be disposed among the first wiring layers 22, and can be formed under the electronic component 23 or in the vicinity of the second surface 20b of the insulator 20, based on practical needs. Alternatively, as shown in FIG. 4', the electronic component 40 is disposed between the conductive pillars 24 and the first wiring layer 22, and can be formed in the vicinity of the first surface 20a or second surface 20b of the insulator 20, based on practical needs.

Figure 5:
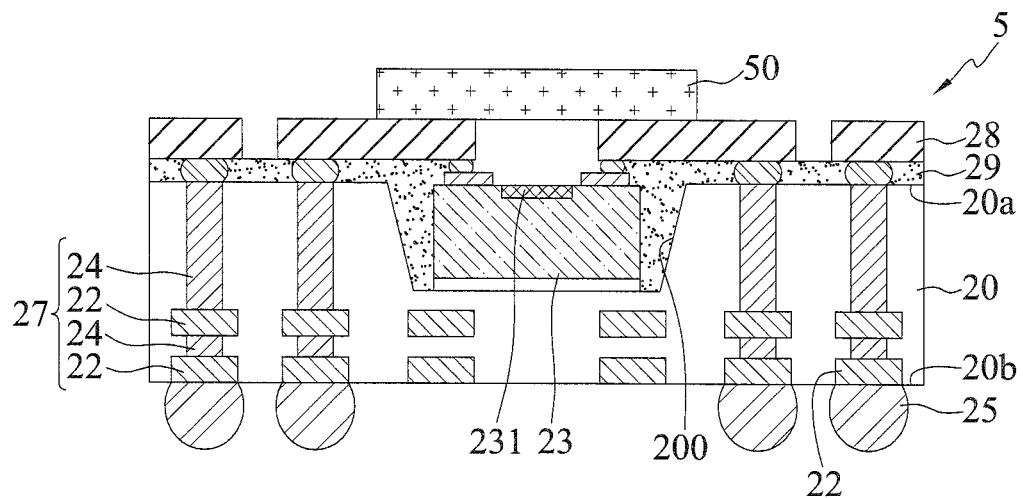
FIGS. 5 and 5' are cross-sectional schematic views showing an electronic package according to a fourth embodiment of the present disclosure.
Figure 5:
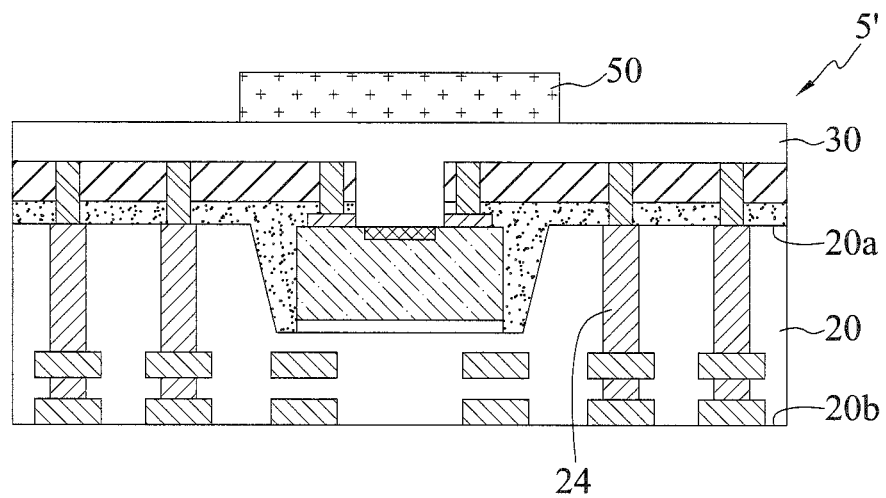

FIGS. 5 and 5' are cross-sectional schematic views showing an electronic package according to a fourth embodiment of the present disclosure. This embodiment differs from the foregoing embodiments in that an electronic package 5 of this embodiment is applied to a camera lens, for example, an additionally formed transparent element 50. However, the rest of the structures are substantially similar to those in the foregoing embodiments. Therefore, the identical parts will not be described hereinafter for brevity.

As shown in FIG. 5, the electronic package 5 further includes a transparent element 50 (such as a lens or a glass) for covering the sensing region 231 of the electronic component 23.

This embodiment could be referred to the structure shown in FIG. 2D, but is not limited thereto.

Alternatively, as shown in FIG. 5', which is corresponding to FIG. 3B, the transparent element 50 is disposed on the covering layer 30.

Further, the transparent element 50 is adhered on the conductive structure 28. Thus, a supporting element is not required, such that the thickness of the overall package can be desirably reduced.

In summary, the electronic package according to the present disclosure has electronic components embedded in the recessed portion to reduce the thickness of the package.

Further, with the use of a conductive structure (such as a lead frame) for electrically connecting with the electronic component, it is not required to consider the arc of bonding wires or the thickness of an encapsulant during the fabricating process. In addition, it is easier to control the thickness of the electronic package, such that thinner thickness is achieved. Further, as it's not a semiconductor fabricating process, the fabrication cost could be further reduced. Moreover, the electronic package could be modified in the design of structure based on the practical requirements, such that the design of the structure is flexible.

The principles and effects of the present disclosure have been described using the above examples, which are not used to limit the present disclosure. Without departing from the spirit and scope of the present disclosure, any one skilled in the art can modify the above examples. Therefore, the scope of the present disclosure should be accorded with the claims appended.

What is claimed is:

1. An electronic package, comprising:
   an insulator having a first surface with at least one recessed portion and a second surface opposing the first surface;
   a wiring structure embedded in the insulator and including a plurality of first wiring layers and a plurality of conductive pillars, wherein the conductive pillars are formed to interconnect the first wiring layers and are coupled to the first surface of the insulator;
   at least one electronic component disposed in the recessed portion, and having at least one sensing region exposed from the first surface of the insulator; and
   a conductive structure disposed on the first surface of the insulator and electrically connected with the electronic component and the conductive pillars, wherein the conductive structure is free from covering the sensing region.

2. The electronic package of claim 1, further comprising a covering layer covering the sensing region.

3. The electronic package of claim 1, wherein the wiring structure is in contact with the electronic component.

4. The electronic package of claim 1, wherein the wiring structure is free from being in contact with the electronic component.

5. The electronic package of claim 1, wherein a bottom part of the recessed portion is made of a metal material, and the electronic component is mounted on the metal material.

6. The electronic package of claim 1, further comprising a second wiring layer formed on the first surface of the insulator and electrically connected with the conductive structure.

7. The electronic package of claim 1, further comprising an insulating protective layer formed on the first surface of the insulator.

8. The electronic package of claim 1, wherein the conductive structure is electrically connected with the electronic component via a plurality of conductive bumps.

9. The electronic package of claim 1, wherein the conductive structure is bonded to the first surface of the insulator via a bonding material, and the bonding material is free from covering the sensing region.

10. The electronic package of claim 1, further comprising a bonding material formed in the recessed portion to securely hold the electronic component in place.

11. The electronic package of claim 1, wherein the conductive structure is a lead frame.

12. The electronic package of claim 1, wherein the conductive structure comprises a lead frame having a plurality of openings and a plurality of conductive bumps disposed in the openings.

13. The electronic package of claim 1, further comprising a plurality of conductive elements formed on the second surface of the insulator.

14. The electronic package of claim 1, further comprising at least one of another electronic component in the insulator.

15. The electronic package of claim 14, wherein the another electronic component is an active component, a passive component or a combination thereof.

16. The electronic package of claim 1, further comprising a transparent element covering the sensing region.

* * * * *